United States Patent [19]
Zsamboky

[11] Patent Number: 5,100,714
[45] Date of Patent: Mar. 31, 1992

[54] METALLIZED CERAMIC SUBSTRATE AND METHOD THEREFOR

[75] Inventor: Kalman F. Zsamboky, Honeoye Falls, N.Y.

[73] Assignee: Ceramic Packaging, Inc., Victor, N.Y.

[21] Appl. No.: 512,892

[22] Filed: Apr. 23, 1990

Related U.S. Application Data

[60] Division of Ser. No. 319,413, Mar. 3, 1989, abandoned, which is a continuation-in-part of Ser. No. 148,143, Jan. 25, 1988, abandoned, which is a continuation of Ser. No. 945,351, Dec. 22, 1986, abandoned, said Ser. No. 319,413, is a continuation-in-part of Ser. No. 205,534, Jun. 10, 1988, abandoned, which is a continuation of Ser. No. 889,678, Jul. 24, 1986, abandoned.

[51] Int. Cl.$^5$ .............................................. B32B 3/10
[52] U.S. Cl. .................................... 428/137; 428/209; 428/210; 428/432; 428/140; 428/698; 428/627; 428/632; 428/901
[58] Field of Search ............... 428/209, 210, 901, 426, 428/432, 457, 698, 137, 140, 131, 472, 632, 627

[56] References Cited
U.S. PATENT DOCUMENTS

| | | | |
|---|---|---|---|
| 3,091,548 | 5/1963 | Dillon, II | 428/472 |
| 3,404,020 | 10/1968 | Woolley | 428/432 |
| 3,975,165 | 8/1976 | Elbert | 428/472 |
| 4,055,451 | 10/1977 | Cockbain | 428/472 |
| 4,109,031 | 8/1978 | Marscher | 428/472 |
| 4,287,253 | 9/1981 | Leech | 428/901 |
| 4,338,380 | 7/1982 | Erickson | 428/209 |
| 4,360,570 | 11/1982 | Andreades | 428/209 |
| 4,414,281 | 11/1983 | Hoda | 428/432 |
| 4,500,383 | 2/1985 | Kashiwagi | 428/432 |
| 4,981,761 | 1/1991 | Ookouchi | 428/627 |

Primary Examiner—Ellis P. Robinson
Assistant Examiner—Nasser Ahmad
Attorney, Agent, or Firm—Dressler, Goldsmith, Shore, Sutker & Milnamow, Ltd.

[57] ABSTRACT

A metallized ceramic substrate having an enhanced bond strength between the ceramic substrate and a conductive metal layer bonded thereto is disclosed. The metallized ceramic substrate includes a heterogeneous juncture band between a ceramic workpiece and a layer of electrically conductive material. A process for making the metallized ceramic substrate is also disclosed. The process includes an acid etchant step that increases the actual surface area of the treated surface of the ceramic workpiece without undermining the integrity of the ceramic surface while at the same time selectively attacking vitreous binder phase present between substrate grains and creating even deeper penetration at the relatively higher energy triple point junctures. In this manner, metal anchor sites that enhance adhesion are provided. During subsequent high temperature firing these anchors hold the resulting composite together as a chemical bond is formed in addition to a mechanical bond or interlock.

9 Claims, 8 Drawing Sheets

METALLIZED CERAMIC SUBSTRATE AND METHOD THEREFOR

CROSS-REFERENCE TO RELATED APPLICATIONS

This application is a division of copending application U.S. Ser. No. 07/319,413 filed on Mar. 3, 1989, now abandoned which a continuation-in-part of copending application Ser. No. 148,143, filed on Jan. 25, 1988, now abandoned which, in turn is a continuation of U.S. Ser. No. 945,351, filed on Dec. 22, 1986. U.S. Ser. No. 07/319,413, now abandoned, which is also a continuation-in-part of application U.S. Ser. No. 205,534, filed on June 10, 1988, which, in turn is a continuation of U.S. Ser. No. 889,678, filed on July 24, 1986, now abandoned.

FIELD OF THE INVENTION

This invention relates to a metallized ceramic substrate having enhanced metal-to-ceramic bond strength. One aspect of the present invention relates to an improved method of metallizing alumina (or similar) substrates through direct autocatalytic (electroless) deposition of a metal layer thereon on which provides a chemical bond as well as an improved mechanical bond between the substrate and the metal layer able to withstand multiple high temperature thick film processing firings.

BACKGROUND OF THE INVENTION

Hybrid assemblies and printed circuits utilize a ceramic substrate or a glass filled epoxy substrate, respectively, to which a conductive metal layer, such as a copper layer, has been applied so that metallized conductor patterns can be formed. The thickness of the conductive layer can be built up thereafter by conventional plating with the same metal. Alternatively, after coating the substrate with a metal such as copper, conventional plating with other metals, such as nickel or gold, can follow to build up the thickness of the conductive layer.

The state-of-the-art to date consists of either screen printing usually precious metal inks on the ceramic substrate or depositing very thin layers of vacuum deposited metallization to form the conductive circuit patterns. Both techniques are costly. However, a very large market has developed demanding both less expensive methods and more efficient circuitry.

A thin film circuit on ceramic typically consists of a thin film of metal deposited on a ceramic substrate by one of the vacuum deposition techniques. In these techniques, generally a chromium or molybdenum film, having a thickness of about 0.02 micrometers ($\mu$m), acts as a bonding agent for copper or gold layers. Photolithography is used to produce high resolution patterns by etching away the excess thin metal film. Such conductive patterns may be electroplated up to, typically, 7 $\mu$m thick. However, due to their high costs, thin film circuits have been limited to specialized applications such as high frequency and military applications where a high pattern resolution is vital.

Another method of producing printed circuits is known as the thick film method. A thick film printed circuit comprises a conductor pattern consisting of a metal and glass frit and/or metal oxide particles fired on a ceramic substrate. Typically, the film has a thickness of about 15 $\mu$m. Thick film circuits have been widely used and are produced by screen printing on a circuit pattern with a paste containing the conductive metal powder and a glass frit and/or metal oxide particles in an organic carrier. After printing, the ceramic parts are fired in a furnace to burn off the carrier, sinter the conductive metal particles and fuse the glass. These conductors are firmly bonded to the ceramic by the glass and thus components may be attached to the conductors by soldering, wire bonding and the like.

A disadvantage in using thick film printed circuits is that the conductors have only a 30 to 60 percent of the conductivity of the pure metal. In general, there is a need for the higher conductivity attainable by pure metal in order to provide the necessary conductive paths for higher density circuits or greater power carrying capabilities.

Another disadvantage with regard to thick film printed circuits is that the minimum conductor width and minimum space between conductors which can be obtained by screen printing and firing under these procedures is generally 125 and 200 $\mu$m, respectively, even under special high quality procedures. Under normal production conditions, these minima are 200 and 250 $\mu$m, respectively, which restrict denser circuit design considerations. In addition, thru-hole metallization is difficult due to the inconsistency of the paste process to conform readily to the internal characteristics of the holes in the ceramic substrate.

For ceramic surfaces requiring higher interconnection density, multi-layer techniques are often used. In order to produce thick film multi-layer circuits, a first layer of metal powder and glass frit is printed on a ceramic substrate and fired, typically at 850° C. Subsequently, an insulating dielectric layer is screened over the conductor pattern, leaving exposed only the points at which contact is to be made to the next layer of metallization. This dielectric pattern is also fired at approximately 850° C. (about 1562° F.). This procedure is repeated to produce second and subsequent conductive or dielectric layers until the desired number of layers has been produced to provide the circuit density required.

Attempts also have been made in the past to directly bond pure metal conductors to ceramic substrates including alumina in order to achieve higher conductivity for ceramic-based circuit patterns. Illustrative of such attempts is U.S. Pat. No. 3,994,430 to Cusano et al. which describes a process which involves the bonding of copper sheets to alumina by heating the copper in air to form an oxide layer on its surface. The prepared copper sheet is then bonded to the alumina at a temperature between 1065° C. and 1075° C. in a nitrogen furnace. However, in order to produce a well adhered copper foil with minimum blisters, the process parameters have to be controlled very closely, which is hard to do under commercial operating conditions.

Another process for the direct bonding of metal sheets to non-metallic substrates is described in U.S. Pat. No. 3,766,634 to Babcock according to which a metal foil is juxtaposed on a ceramic substrate and heat-bonded thereto allegedly utilizing a copper-copper oxide eutectic that is formed during the bonding process. However, this method suffers from many of the same problems as the aforesaid Cusano et al. process, including the inability to provide through hole coverage, the entrapment of gases which cause blistering between the metal layer and the substrate, as well the inherent limitations on the ability to provide narrow conductive metal traces that are sufficiently adherent to the substrate for efficient handling and processing.

Although the above described metallization systems have been commercially used, the need for direct, simple metallization of ceramics for producing pure metal conductors, such as copper, without deficiencies has prompted a continuing series of patents and proposed processes that utilize electroless deposition of an initial conductive metal layer onto the ceramic substrate. For example, U.S. Pat. No. 3,296,012 to Stalnecker, Jr. discloses a method of producing a microporous surface for electrolessly plating alumina.

U.S. Pat. No. 3,690,921 to Elmore involves the use of molten sodium hydroxide to etch a ceramic surface. In this process, subsequently, sodium hydroxide is rinsed from the ceramic surface with water, the ceramic surface neutralized with dilute sulfuric acid and rinsed again before sensitizing with a stannous chloride solution, rinsing and seeding with a palldium chloride solution, to catalyze the surface for electroless metal plating.

Although the process of Elmore provides good surface coverage it reached only limited acceptance for commercial production because of low adhesion. Moreover, the alkaline surface treatment undermines the substrate surface structure. Although the metal deposit usually covered 90 percent of the surface area or even more, see for example U.S. Pat. No. 4,574,094 to DeLuca et al at column 3, this was unacceptable since any imperfection in the foreign metal film may cause defective circuit conductors and a failure of such imperfection occurs in a fine line conductor pattern.

U.S. Pat. No. 4,428,986 to Schachameyer discloses a method for direct autocatalytic plating of a metal film on a beryllia substrate. The method comprises roughening the surface of the beryllia substrate by immersing it in a 50 percent sodium hydroxide solution, rinsing with water, etching the beryllia substrate with fluoroboric acid, rinsing the water, immersing it in a solution of 5 g/l stannous chloride and 3N hydrochloric acid, rinsing with water, treating the beryllia surface with a 0.1 g/l palladium chloride solution, rinsing with water and then electrolessly plating nickel on the beryllia. However, the method of Schachameyer has shortcomings as discussed hereinbelow.

When depositing copper metal on a ceramic substrate, the strength of the copper-ceramic bond is very important. This is because if the adhesion between the two substances is weak, the copper may peel off of the ceramic upon normal thermal cycling, thus rendering the component worthless. In the etching step of Schachameyer, silica and magnesium are removed from the grain boundaries of the beryllia thereby weakening the beryllia surface and as a result, the method of this patent was able to achieve only 1.7 MPascal bond strength. This bond strength is too low for practical use required for thick film type circuits.

Another method of applying a layer of a conductive metal such as copper onto a ceramic substrate is described in U.S. Pat. No. 4,574,094 to De Luca et al. According to this process the ceramic surface to which a conductive metal layer is to be adhered is first etched with an alkali metal preparation, then prepared for electroless deposition of the conductive metal layer, and followed by the electroless deposition of such metal layer. Nevertheless, the metal-to-ceramic bond strength that can be achieved by this technique is not adequate for the produced metal ceramic composite to withstand repeated firings at thick film firing temperatures of about 850° C. (about 1562° F.).

The prior art processes heretofore available have been unreliable as they resulted in incomplete surface coverage with, or unacceptably low bond strength of, a formed metal deposit, or both, and are therefore unsatisfactory for commercial product purposes. However, it is desirable for economic and increased circuit design capability reasons to have metallization adhesion to the substrate that will withstand subsequent high temperature thick film processing firings. Attempts heretofore to reproducibly make circuit patterns by direct autocatalytic deposition have only experienced limited success due to inadequate adhesion of the metal layer. Inadequate adhesion results in an inability of the layer to withstand subsequent exposure to thick film processing temperatures. However, the present invention satisfies the foregoing desires by providing an electrolessly deposited, direct bonded conductor having excellent adhesion that can withstand elevated thick film temperature firings and a process for producing the same. Concurrently, thru-hole conductor paths can be provided, if desired, without secondary operations to the electrodeposition process.

SUMMARY OF THE INVENTION

The present invention contemplates a metallized ceramic substrate having an enhanced bond strength between the ceramic substrate and a conductive metal layer bonded thereto. More particularly, articles of manufacture embodying the present invention are metal-ceramic composites that comprise a monolithic ceramic workpiece having a working surface for supporting a layer of conductive material, a layer of electrically conductive material on the working surface, and a heterogeneous juncture band between, and substantially coextensive with, the ceramic workpiece and the metal layer. The working surface is not necessarily planar and includes as well surfaces that define holes or apertures in the ceramic workpiece within which the conductive material is situated.

When the conductive metal is copper, the juncture band typically is at least about 8 micrometers thick. The juncture band is constituted by exposed ceramic grains unitary with the workpiece and having a metal-wetted surface area that is at least about twice the apparent surface area of the metal layer overlying the juncture band, as well as by finger-like metal protuberances unitary with the metal layer and occupying the space between the exposed ceramic grains.

The process contemplated by the present invention comprises the steps of first treating a surface of a ceramic substrate with an acid etchant so as to increase the actual surface area of the treated surface, i.e., the surface area available for metal-to-ceramic contact, by at least about 100 percent over the apparent surface area without undermining the substrate surface structure integrity; sensitizing the resulting, increased surface area for electroless deposition; catalyzing the sensitized area by applying thereto an alkaline palladium solution so as to deposit palladium ions thereon; and thereafter reducing in situ the deposited palladium ions to palladium metal; and then depositing a conductive metal layer onto the palladium metal by electroless deposition. The conductive metal layer is then built up to a desired, greater thickness by electroless or electrodeposition of the conductive metal. Thereafter, the produced metal-ceramic composite is fired in an atmosphere having a controlled oxygen content and at an elevated temperature so as to melt some of the conductive metal composition present at the juncture band and to cause at least a portion of the molten metal composition to flow into interstitial spaces around the ceramic grains. Subsequent cooling causes the molten metal composition to solidify therein.

DETAILED DESCRIPTION OF THE PREFERRED EMBODIMENTS

Figure 1:
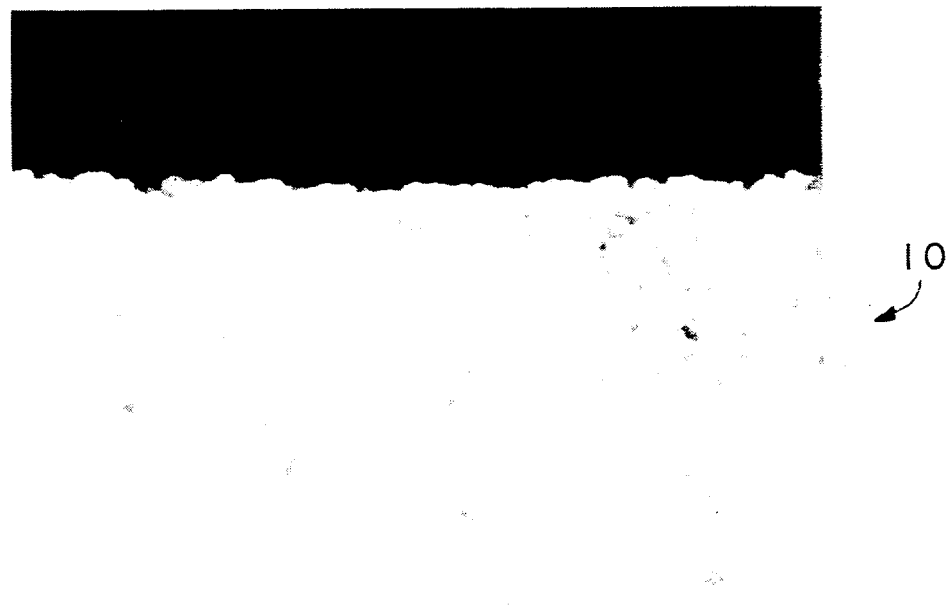
FIG. 1 is a photomicrograph of a section of a control ceramic substrate.

A metal-ceramic composite or workpiece embodying the present invention exhibits an exceptionally strong bond between a metal layer that overlies a ceramic substrate and the substrate itself. This is believed to be the result of a heterogeneous juncture band between the metal and the ceramic within which the metal composition that is present adheres to a working surface of the substrate that is much larger in area than the respective apparent surfaces of the metal layer and the ceramic substrate that are juxtaposed relative to one another in the produced composite. The term "working surface" as used herein and in the appended claims designates a surface, including an interior surface that defines a hole, aperture or cavity in the workpiece, of the ceramic workpiece available for supporting a conductive metal layer.

The juncture band, and thus the resulting metal/-ceramic substrate composite is capable of withstanding repeated firing cycles at a temperature in excess of 850° C. (1562° F.). Heretofore no metal/ceramic composite that includes an electroless conductive metal layer has been able to achieve such a performance level. Within the juncture band ceramic grains unitary with the substrate define therebetween interstitial spaces that are substantially filled with the conductive metal and/or a conductive metal composition that may be a lower melting eutectic or alloy of the conductive metal, such as copper.

A typical juncture band when copper is the conductive metal is at least about 8 micrometers thick, and preferably about 9 to about 13 micrometers thick. The interstitial spaces between individual grains provide a relatively large number of metal penetration sites into the ceramic material, typically of the order of about 15,000 penetration sites per linear inch (about 225 million sites per square inch). As a result of such penetration sites, metal fingers or anchors unitary with the deposited conductive metal layer extend into the ceramic substrate to a depth of about 0.0005 inch and anchor the conductive metal layer to the substrate.

Moreover, such penetration sites also permit effective conductive metal layer deposition within through holes or apertures machined or formed into the ceramic substrate, thereby providing an effective electrically conductive path through the holes or apertures from one surface of the ceramic substrate to another surface without the need for conductive rivets or the like expedients that have to be utilized with metal-ceramic composites made by techniques that bond a discrete, conductive metal foil to a ceramic substrate.

Currently available metal-ceramic workpieces have been analyzed microscopically and are compared below to a metal-ceramic workpiece that embodies the present invention. A section of each workpiece was cold mounted, finely round and polished using the BUEHLER DIALOG method of planar grinding, sample integrity and final polishing. This method is described by Nelson, James A., "A New Direction for Metallography," Practical Metallography, May 1989.

In accordance with the above BUEHLER DIALOG method, each sample was mounted in an Epoxide ® mounting resin that is a polyethylmethacrylate and benzoyl peroxide admixture. The mounted sample was held upright using plastic sampl-klips.

The mounted sample was secured to a rotatable upper disk of a polishing apparatus. The upper disk was rotated at a relatively slow speed during the polishing procedure.

Various polishing disks were secured to a rotatable bottom disk of the apparatus. The bottom disk was rotated at various, relatively fast speeds, described hereinbelow, during the polishing procedure.

The polishing procedure included a planar grinding stage, two sample integrity stages, a final polishing stage and a rinse stage.

The planar grinding stage utilized a Metlap ® 10 polishing disk which is the softest polishing disk made by BUEHLER. The abrasive utilized was a Metadi ® diamond aerosol which includes a glycol-type aerosol spray containing about 30 micrometer ($\mu$m) diamond particles. The abrasive dispensing sequence included applying the abrasive onto the disk during polishing for one second followed by 30 seconds wherein no abrasive was dispensed. Water was used as a lubricant extender. The sample was polished for a timer period of 3 minutes while a 5-pound force was exerted on the sample. The polishing disk was rotated at a speed of 240 revolutions per minute (rpm) in a direction opposite that of the sample.

The first sample integrity stage utilized a Metlap ® 4 polishing disk which is the next to the hardest polishing disk made by BUEHLER. The abrasive utilized was Metadi ® diamond slurry which includes a fatty acid/-polyalkylene glycol and about 6 $\mu$m diamond particles. The abrasive dispensing sequence consisted of applying the abrasive onto the disk during polishing for one second followed by 10 seconds wherein no abrasive was dispensed. No lubricant extender was utilized. The sample was polished for a time period of 5 minutes while a 5-pound force was exerted on the sample. The polishing disk was rotated at a speed of 50 rpm and in a direction of rotation opposite that of the sample.

The second sample integrity stage utilized a Texmet ® polishing disk which is an oil/water resistant chemotextile material that is used as a polishing cloth. The abrasive utilized was a Metadi ® diamond slurry which includes a fatty acid/polyalkylene glycol and about 3 $\mu$m diamond particles. The abrasive dispensing sequence of the abrasive onto the disk during polishing was one second of dispensing followed by 10 seconds wherein no abrasive was dispensed. A lubricant extender was not utilized. The sample was polished for a time period of 5 minutes while a 5-pound force was exerted on the sample. The polishing disk was rotated at a speed of 20 rpm in the same direction as the specimen.

In the final polishing stage, a Texmet ® polishing disc was also utilized. The abrasive utilized was Mastermet ® which is a fine polishing suspension of 0.06 $\mu$m colloidal silica ($SiO_2$) in an alkaline pH aqueous base. The abrasive was dispensed continuously during this polishing stage. No lubricant extender was utilized. The sample was polished for a time period of 5 minutes while a 10-pound force was exerted on the sample. The polishing disk was rotated at a speed of 240 rpm in a direction opposite that of the specimen.

The specimen was then rinsed with water on a cloth for fifteen seconds after the completion of the final polishing stage.

The mounted samples were then studied under various magnifications, including an untreated control sample of the ceramic substrate alone.

Referring to FIG. 1, taken at a magnification of 1000×, it is seen that the control ceramic substrate 10 itself has a relatively smooth surface free from substantial irregularities. However, a distinct grain structure is present in the substrate.

Figure 2:
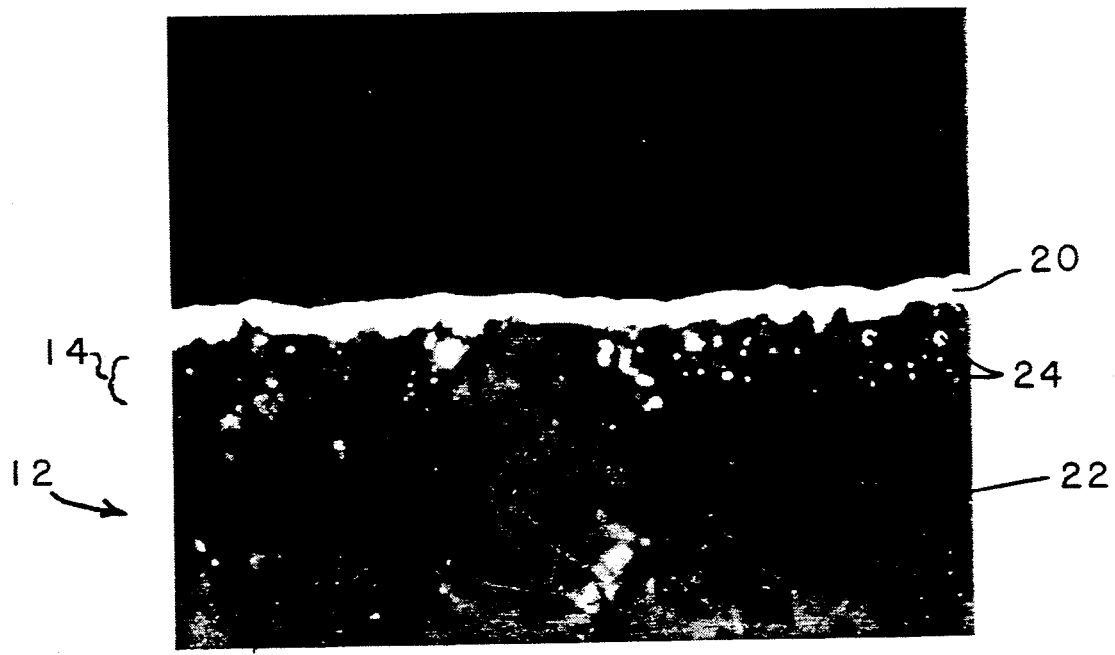
FIG. 2 is a photomicrograph of a section of a metal-ceramic composite embodying the present invention.

FIG. 2 on the other hand shows a section of a metal-ceramic composite 12 embodying the present invention. The photomicrograph was taken under the same magnification as FIG. 1 (1000×). Specifically, composite 12 is constituted by copper layer 20 coextensive with ceramic substrate 22. Copper layer 20 is about 0.00013 inch thick. The copper-ceramic interface is substantially more irregular than the surface of the control (FIG. 1) and thus provides a working surface having an increased metal-wetted ceramic contact area between the metal layer and the underlying ceramic substrate.

Below the copper layer 20 is seen juncture band 14 defined by metal-containing islands 24 distributed among the ceramic grains of the substrate 22 that are monolithic therewith. In this particular instance juncture band 14 has an average thickness of about 0.0005 inch. Further study of this particular sample revealed that the metal-containing islands 24 were conductively connected to copper layer 20 and were sections of metallic penetrations into the ceramic substrate 22. Approximately 15,000 such penetrations per linear inch (about $225 \times 10^6$ penetrations per square inch) were noted. Frequent individual penetrations as deep as about 0.0005 inch were noted. The average depth of such penetrations was about 0.0003 inch.

Figure 3:
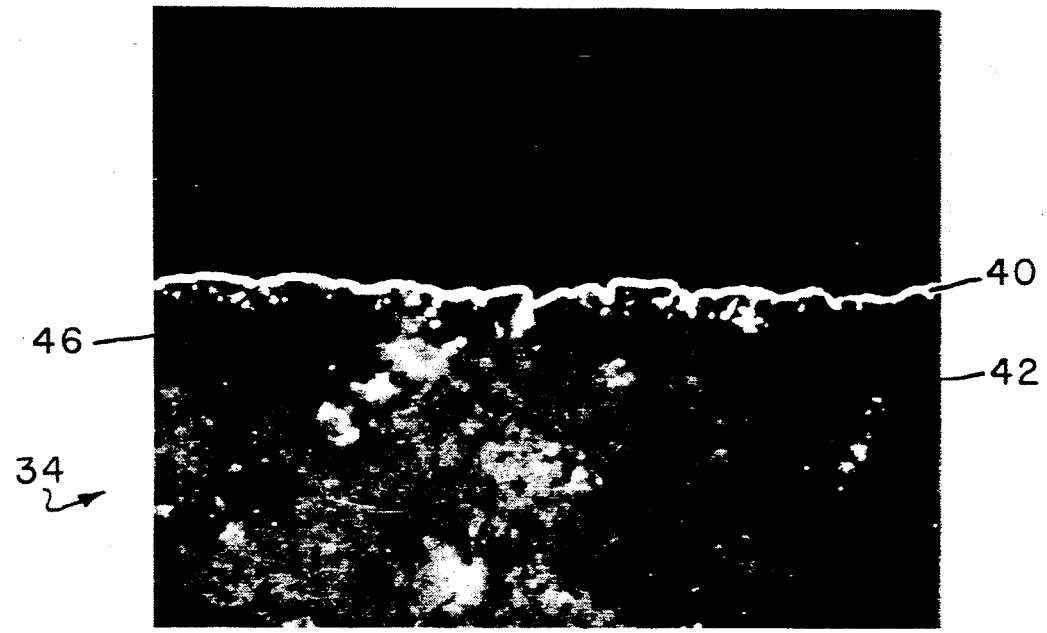
FIG. 3 is a photomicrograph of a section of a metal-ceramic composite made by an alkali metal hydroxide-etched substrate method.

FIG. 3 is a photomicrograph of a section of a metal-ceramic composite 34 made by initially depositing electroless copper onto an alkali metal hydroxide-etched ceramic substrate surface (the alkali metal hydroxide-etched substrate method). The photomicrograph was also made under the same magnification as FIG. 1 (1000×). The composite 34 is constituted by copper layer 40 that is coextensive with ceramic substrate 42. Copper layer 40 is about 0.00003 inch thick. The copper-ceramic interface is less irregular than the surface of the metal-ceramic composite 12 (FIG. 2) embodying the present invention. Thus, there is less of a metal-wetted ceramic contact area between the metal layer 40 and the underlying ceramic substrate 42. The lesser contact area, in turn, accounts for a lower peel strength.

Some metal-containing material 46 has penetrated into the ceramic workpiece 42. However, there are far fewer penetrations as compared to the metal-ceramic composite 12 (FIG. 2) of the present invention. That is, there are only about 4,000 penetrations per linear inch (about $16 \times 10^6$ penetrations per square inch). Furthermore, the penetrations were not as deep into the substrate. The deepest individual penetrations were only about 0.00025 inch. The average depth of these penetrations was about less than 0.0001 inch. Thus, the depth of penetration is far less than that obtained in the metal-ceramic composite 12 (FIG. 2). There is no heterogeneous juncture band present.

Figure 4:
FIG. 4 is a photomicrograph of a section of a metal-ceramic composite made by a foil heat-bonding method.

FIG. 4 is a photomicrograph of a section of a metal-ceramic composite 56 made by juxtaposing a copper foil on a ceramic substrate and then heat-bonding the foil and the substrate (the foil heat-bonding method). The photomicrograph was taken at the same magnification as FIG. 1 (1000×). The composite 56 is constituted by copper layer 60 that is not coextensive with the ceramic substrate 62. Copper layer 60 is about 0.00325 inch thick. This absence of coextensiveness is due to blister 69 as well as small voids 68 at the interface between the copper layer 60 and the ceramic substrate 62. Furthermore, there is no penetration of the copper into the ceramic substrate 62. Thus, again there is no heterogeneous juncture band present.

Figure 5:
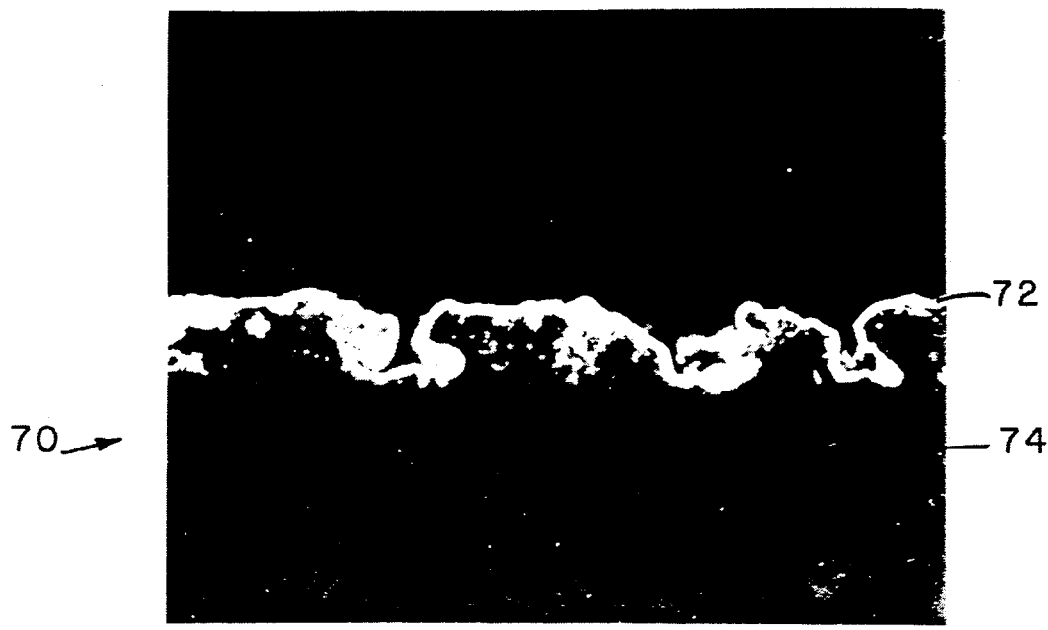
FIG. 5 is a photomicrograph of a section of a metal-ceramic composite made by a plated thick film method.

FIG. 5 is a photomicrograph of a section of a metal-ceramic composite 70 in which a plated thick film is applied to a secondary ceramic-glass layer fired onto the substrate (the plated thick film method). See, Jones, "Evaluation of Copper Plated Ceramic Substrates", International Society for Hybrid Microelectronics (ISHM), 1988 Proceedings, Seattle, Wash., pp. 164–169, at p. 165. The photomicrograph was taken at the same magnification as FIG. 1 (1000×). The composite 70 is constituted by copper layer 72 that is coextensive with ceramic substrate 74. The copper layer 72 is about 0.00005 inch thick. The copper-ceramic interface is characterized by a few, wide, shallow irregularities as compared to the copper-ceramic interface of the metal-ceramic composite 12 of the present invention (FIG. 2). These large irregularities do not result in a substrate as occurs when many, narrow, deep irregularities are present as in the present invention.

The currently available metal-ceramic workpieces were then subjected to a pull (pull/peel strength) test by soldering a wire lead with a 90 degree bend to a square pad of the metal deposited on a 96 percent alumina substrate so that the bend is spaced 50 mils from the edge of the pad, and measuring the force required to pull the pad away from the substrate as tension is applied to the wire substantially normal to the plane of the substrate.

The results of the pull tests indicated that the metal-ceramic composite 12 coated using the present invention had a pull strength of at least about 10 pounds per 100 mil square pad, and in many instances reached a pull strength in excess of about 20 pounds per 100 mil square pad. This observed pull strength is far superior to the minimum requirement of current major users of 4 pounds per 80 mil square pad (6.25 pounds per 100 mil square pad). Furthermore, this pull strength of the present invention is vastly superior to the pull strengths exhibited by the workpieces coated by the other methods.

The metal-ceramic composite 34 coated using the alkali metal hydroxide-etched surface method is reported by PCK Technology Division of Kollmorgen Corporation, Dallas, Tex., who markets this method, to have a pull strength of only 6 pounds per 80 mil square pad, ISHM 1988 Proceedings, Seattle, Wash., pp. 196 et seq.

The metal-ceramic composite 70 coated using the plated thick film method is reported in the supplier's literature, received with a sample of the metal-ceramic composite 18, to have a pull strength of only 5 pounds per 80 mil square pad.

The metal-ceramic composites 34 and 70 therefore are seen to exhibit pull strengths significantly lower than the pull strength of the metal-ceramic composite 12 of the present invention.

After the pull test, the surface of the workpiece from which the copper layer was pulled back was photographed using an International Scientific Instruments' (ISI) Model No. SR-50 scanning electron beam microscope (SEM). The photomicrographs were all taken at the same magnification (7500×).

Figure 6:
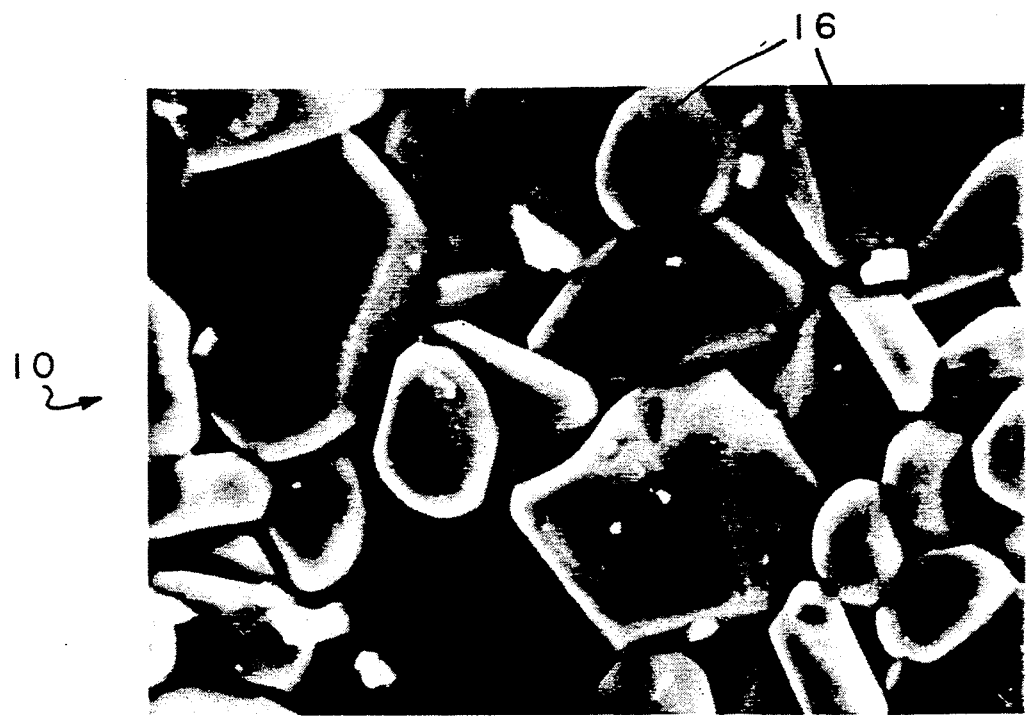
FIG. 6 is a photomicrograph of a top view of a control ceramic substrate that was not coated with copper.

FIG. 6 is a photomicrograph of the ceramic surface of an untreated control ceramic workpiece 10 that is not coated with copper. The ceramic grains 16 are interlocked with each other and present a contact area.

Figure 7:
FIG. 7 is a photomicrograph of the surface of a metal-ceramic composite after pulling off of the copper layer that was deposited by the present method.

FIG. 7 is a photomicrograph of the surface of a metal-ceramic composite 12 coated with copper by the present method. The ceramic grains 26 are also interlocked with each other thus presenting a monolithic substrate surface. There is no evidence of grain pull out.

Furthermore, FIG. 7 shows the increased surface area, as compared to the control workpiece 10 (FIG. 6), that is created by the acid etchant solutions of the present invention. The desirability of this increased surface area has been discussed hereinbefore. The finger-like metal protuberances are also seen.

This tight, interlocked, grain structure having an increased surface area and remnants of torn anchors indicates that the surface is well adapted to receive, and hold, the copper layer. The monolithic nature of the substrate working surface has been maintained.

Figure 8:
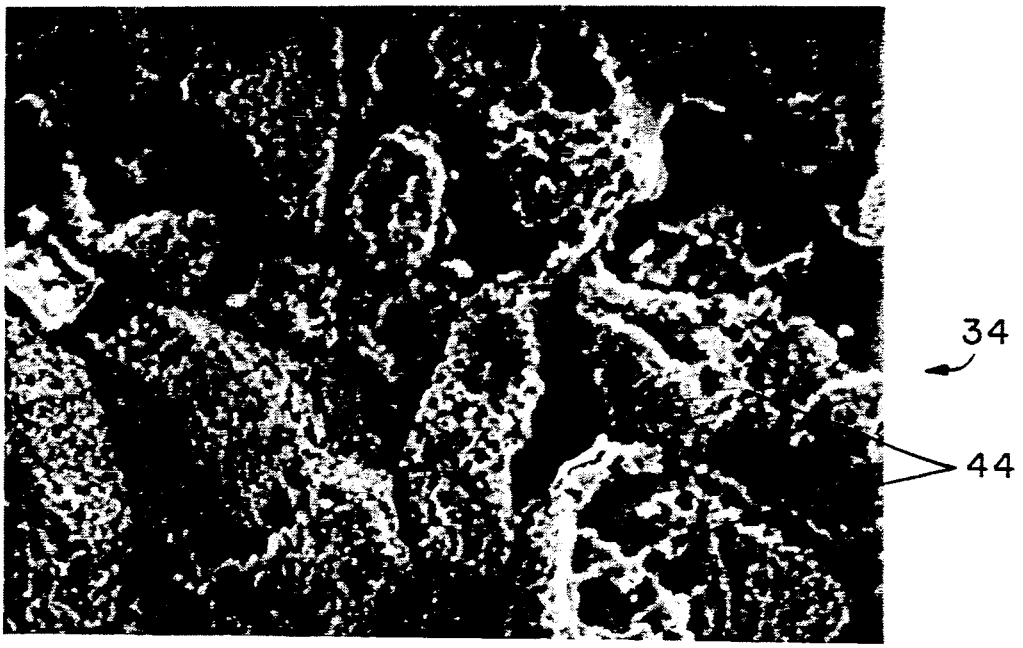
FIG. 8 is a photomicrograph of the surface of a metal-ceramic composite after pulling off of the copper layer that was deposited by the alkali metal hydroxide-etched substrate method.

FIG. 8 is a photomicrograph of the ceramic surface of a metal-ceramic composite 34 coated with copper by the alkali metal hydroxide-etched substrate method. The ceramic grains 44 of the ceramic-metal composite 34 are more vulnerable to grain pull out because they are not nearly as tightly interlocked with each other, as compared to the metal-ceramic composite 12 (FIG. 7), due to undermining by the etchant. A monolithic substrate surface has not been preserved.

Figure 9:
FIG. 9 is a photomicrograph of the surface of a blister region of a metal-ceramic composite, after pulling off of the copper layer that was deposited by the foil heat-bonding method.

FIG. 9 is a photomicrograph of the ceramic surface of a metal-ceramic composite 56 coated with copper by the foil heat-bonding method. There was a blister (void) in this area where the photomicrograph was taken. While the ceramic grains 64 are interlocked, there is no indication that copper had adhered to the ceramic surface in the region under the blister.

Figure 10:
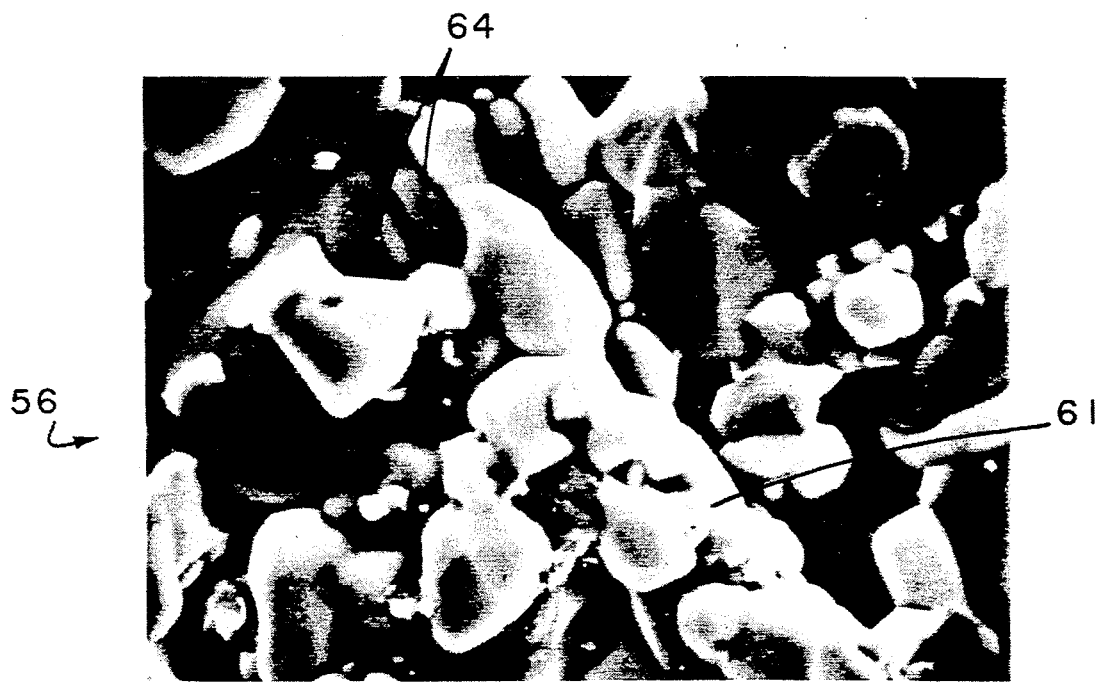
FIG. 10 is a photomicrograph of the surface of a blister-free region of a metal-ceramic composite, after pulling off of the copper layer that was deposited by the foil heat-bonding method.

FIG. 10 is a photomicrograph of the ceramic surface of a metal-ceramic composite 56 coated with copper by the foil heat-bonding method. However, there was no blister (void) in this area where the photomicrograph was taken. The ceramic grains 64 are interlocked and there is no indication of grain pull out. The presence of molten and resolidified eutectic 61 is also evident.

Figure 11:
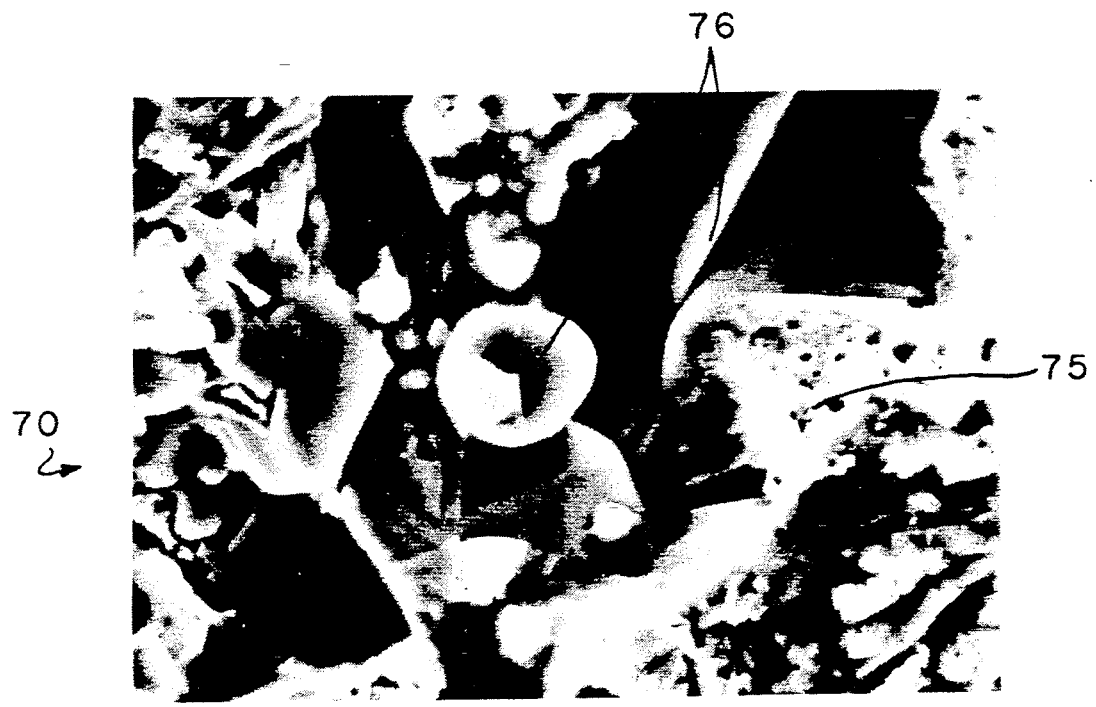
FIG. 11 is a photomicrograph of the surface of a metal-ceramic composite after pulling off of the copper layer that was deposited by the plated thick film method.

FIG. 11 is a photomicrograph of the ceramic surface of a metal-ceramic composite 70 coated with copper by the plated thick film method. The ceramic grains 76 are unchanged and show no sign of etching. Moreover, there is evidence of fused glass frit 75.

Figure 12:
FIG. 12 is a photomicrograph of the copper surface of a metal-ceramic composite produced by the present invention.

FIG. 12 is a photomicrograph of copper surface 18 of a metal-ceramic composite 12 that was coated with copper by the present method. The photomicrograph was taken using the SEM at a magnification of 2500×. The copper surface 18 is smooth, continuous and uniform. This surface indicates that good circuits can be made from the ceramic-metal composite 12.

Figure 13:
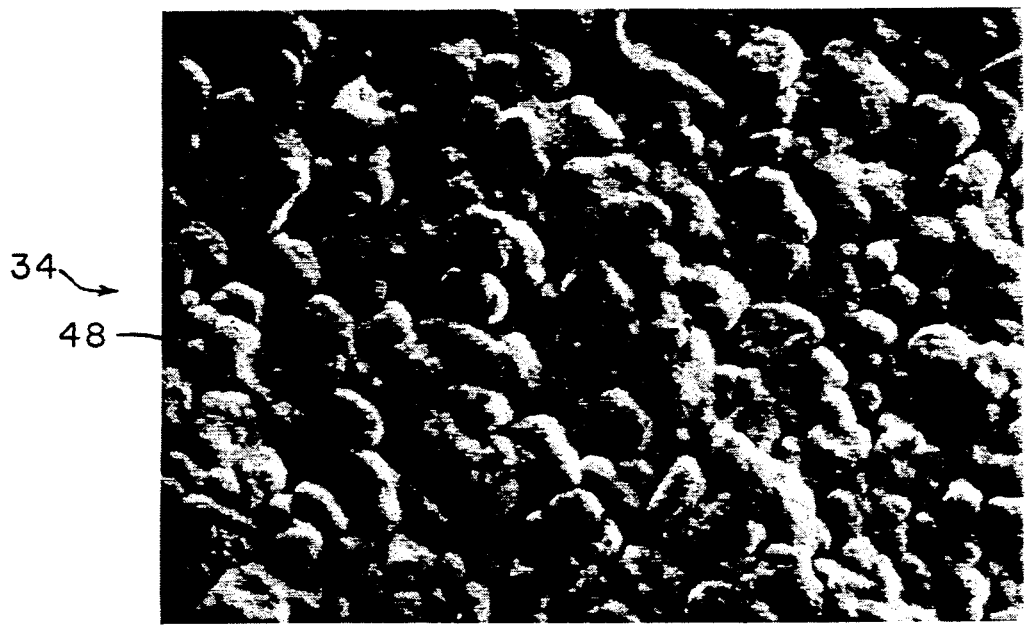
FIG. 13 is a photomicrograph of a copper surface of a metal-ceramic composite produced by the alkali metal hydroxide-etched substrate method.

FIG. 13 is a photomicrograph of copper surface 48 of a metal-ceramic composite 34 coated with copper by the alkali metal hydroxide-etched substrate method. The photomicrograph was taken using the SEM at a magnification of 2500×. The copper surface 48 is not smooth and uniform, and no evidence of grain growth due to heating is evident. The rough texture of alumina grains on the surface show through the copper layer. These conditions are undesirable because they can adversely affect the circuit path.

Figure 14:
FIG. 14 is a photomicrograph of a copper surface of a metal-ceramic composite produced by the foil heat-bonding method.

FIG. 14 is a photomicrograph of copper surface 66 of a metal-ceramic composite 56 coated with copper by the foil heat-bonding method. The photomicrograph was taken using the SEM at a magnification of 2500×. The copper surface 66 is relatively smooth, due to the smooth surface of the foil used. Copper oxide particles 65 have precipitated out at the top of the copper surface 66 adding to the irregularity thereof. The conductivity along the circuit path may also be reduced as a result.

Figure 15:
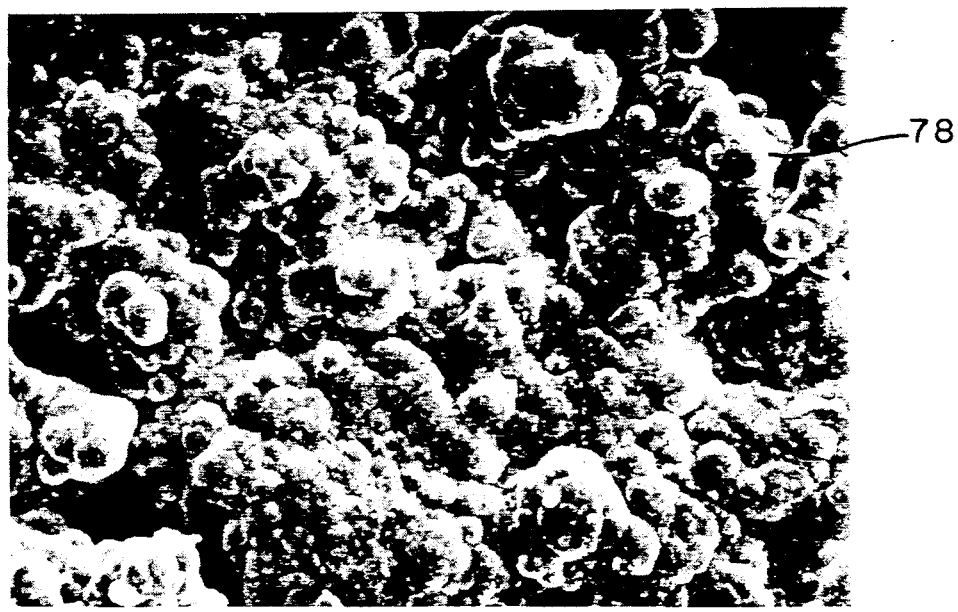
FIG. 15 is a photomicrograph of a copper surface of a metal-ceramic composite produced by the plated thick film method.

FIG. 15 is a photomicrograph of copper surface 78 of a metal-ceramic composite 70 coated with copper by the plated thick film method. The photomicrograph was taken using the SEM at a magnification of 2500×. The copper surface 78 is irregular and has many recesses. These are undesirable features because they can adversely affect the circuit path.

The foregoing articles of manufacture embodying the present invention are made by depositing a conductive metal on a ceramic blank which is also referred to as a substrate. Examples of such ceramic substrates include aluminum oxide (alumina), aluminum nitride, beryllium oxide (beryllia), beryllium titanate, silicon carbide, silicon nitride, ferrite (a ferrimagnetic material having a spinel structure and high electrical resistivity), or other substrates having similar characteristics. Also suitable is porcelanized metal such as that commercially available from Ferro Corporation, Ohio, under the designation ELPOR II ®. In addition, a product sold by Corning Glass Works (New York) under the name PHOTO-CERAN ® is suitable as a substrate. Alumina, beryllia, and aluminum nitride substrates are particularly well suited for practicing the present invention.

In order to configure the ceramic blank as desired for the intended hybrid circuit, the blank is machined with a laser device to produce the desired lines, holes, and other surface characteristics. Similar contour features may also be produced by punching of the green-state substrate blank followed by kiln firing, or by other machining or powder pressing techniques.

After the ceramic substrate has been produced, it is placed in a kiln and slowly heated to a temperature of about 925° C. (about 1700° F.). This temperature is maintained for about thirty to forty minutes in order to degas and clean the substrate. The ceramic substrate is then allowed to cool down slowly, usually over about a twenty-four hour period.

The initial layer of conductive metal is placed onto the ceramic substrate by electroless deposition, utilizing a sensitizer/activator process.

For deposition of the conductive metal onto the ceramic substrate, the faces or surfaces of the substrate must be appropriately prepared by surface etching. To that end the ceramic blank is preheated to about 93° C. (about 200° F.) for approximately five to ten minutes and then dipped into a hot, concentrated acid dip to etch the ceramic surface along the ceramic grain boundaries thereof. Preheating of the substrate lessens the thermal shock which the ceramic substrate undergoes when exposed to the heated acid.

The hot acid dip [about 60° C. or above (about 140° F. or above)] etches the surface of the ceramic substrate as well as removes any unwanted vitreous ceramic which may have been produced by the initial laser machining step. This acid treatment tends to condition the surface, and also roughens the surface for better adhesion of the deposited metal. The acid etchant permeates the glassy or vitreous phase binder at the ceramic grain boundaries more readily than the ceramic grains themselves, thus providing a plurality of exposed grains with recessed grain boundary regions and thus an enhanced surface area that is ultimately wetted by the conductive metal layer to be deposited thereon. A monolithic etched surface is maintained by the substrate, however. While the surface ceramic grains themselves remain unitary with the ceramic substrate and the etched surface is free from particulate material, the acid etchant produces relatively deep crevices or interstices between the individual ceramic grains that are ultimately filled by metal anchors or "fingers" that extend from the metal layer into the interstitial spaces produced by the acid etchant, thereby defining the heterogeneous juncture band. In this manner the ultimately achieved bond strength is substantially enhanced because the effective bonding area between the metal layer and the ceramic substrate is substantially greater, by at least about 100 percent, than the apparent area of the metal layer that overlies the ceramic substrate. For best results, the concentrated acid is heated to near its boiling point so that the etching may take place more rapidly.

The acid dip is prepared from acid etchants capable of etching the particular substrate used, i.e., alumina, aluminum nitride, beryllia, or any of the other ceramic and porcelain substrates mentioned hereinabove. For example, the acid etchant may be phosphoric acid, a halogen acid, i.e., hydrofluoric acid, hydrochloric acid, hydrobromic acid, hydroiodic acid, and the like. In addition, other acid etchants which may be utilized include nitric acid, permanganic acid, fluoboric acid, or any other strong inorganic acid, as well as mixtures thereof. The preferred acid etchant is a hot phosphoric acid solution.

The duration and degree of the acid etch in any given instance depends upon the particular ceramic involved. In all instances, however, the acid etch is carried out for a time period sufficient to remove the vitreous binder present at the grain boundaries of the ceramic substrate without loosening or undermining the individual grains, i.e., while preserving the monolithic character of the ceramic substrate. That is to say, the etching process must not leave loose ceramic particles or residues on the etched ceramic surface. Depth of the acid etch along the grain boundaries of the ceramic substrate extends inwardly from the working surface of the substrate for a distance equal to at least about the diameter of the average grain at the working surface, and preferably deeper, to a depth greater than the diameter of the average grain at the working surface.

Owing to the relatively higher surface energy concentration along intersecting grain boundaries, the acid etch exhibits more aggressive etching action therealong. For example, along the triple point junctures of adjacent grain boundaries the acid etch forms tortuous channels or tunnels within which fingers or anchors of conductive metal are extended during the subsequent electroless deposition step.

After the acid etch, the ceramic substrate is cooled to room temperature, which usually takes approximately fifteen to twenty minutes. The substrate is then rinsed with water and is available for further processing.

The ceramic substrate preferably is next subjected to a number of conditioning and cleaning steps commonly employed in electroless deposition processes in order to properly prepare the surface of the substrate for the deposition of the metal. One such solution which conditions the substrate is an ammonium hydrogen fluoride solution. Other suitable solutions for this purpose are aqueous solutions of ammonium fluoride, sodium hydrogen fluoride, and the like. Dipping the substrate in this solution helps condition the surface of the ceramic substrate for receiving the catalyst thereon, and also promotes ultimate resistance to metal layer damage during subsequent high temperature firing cycles. The ammonium hydrogen fluoride solution is followed by a water rinse step using deionized or distilled water.

Another conditioner is fluoboric acid/wetting agent dip. The wetting agent helps to maintain proper coverage of the other solutions on the substrate and permits liquid penetration into the interstitial spaces between the ceramic grains. This fluoboric acid dip is similarly followed by a rinse step.

After the blank has been dipped in either the ammonium hydrogen fluoride solution and/or the fluoboric acid dip, it is often desirable to further condition and clean the substrate in an alkaline cleaner such as an aqueous sodium hydroxide bath. This alkaline cleaner and conditioner helps to neutralize the strong acids used in the preceding cleaning conditioner baths, and also acts as wetting agent in order to further prepare the surface for metal deposition.

Next, the ceramic substrate is exposed to a cleaner having a neutral pH and also containing a wetting agent. After this cleaner conditioner treatment, the substrate is again rinsed with deionized or distilled water.

The ceramic blank preferably is next dipped into an aqueous sodium persulfate solution. This solution provides a precautionary treatment in that it acts as an etchant for and removes any copper which may have remained on the substrate from earlier handling or processing steps. The substrate is then again rinsed with deionized or distilled water.

After performing the above cleaning and conditioning steps, the working surface of the ceramic substrate is ready for the electroless deposition of metal. In a typical such procedure, the first step is the introduction of the ceramic substrate into a predip solution containing a conditioner and a wetting agent.

After the predip solution, the ceramic substrate is dipped into an activator solution. In the present method, an alkaline ionic palladium activator solution is used. This palladium solution is different from the typical palladium solutions used to provide activation for electroless deposition in that the palladium solution is alkaline, i.e., having a pH value of above 7. Such alkaline solutions usually contain dissolved NaOH, KOH, LiOH, or other metal hydroxides, in addition to palladium ions.

Previous methods of depositing metal such as copper, have called for a highly acidic palladium and tin solution in which the palladium was present in colloidal form. Using such solutions, tin was deposited on the substrate first and then the palladium. Thereafter, the tin was etched away. However, the present method, by using an alkaline palladium solution, introduces no tin onto the substrate and thus there is no need for a corresponding tin etch. This allows the palladium to be deposited directly onto the surface of the ceramic substrate and without the possibility of disturbing the palladium when etching away the tin.

The alkaline palladium solution of the present invention also differs from the prior art palladium solutions in that the concentration of palladium is lower than in previous solutions. In the method aspect of the present invention, a palladium concentration of approximately 50 to less than about 200 parts per million (ppm) palladium is used. The optimum and preferred palladium concentration is about 150 ppm. In this manner, a relatively thin layer of readily reducible palladium ions is deposited on the substrate. The ceramic substrate is rinsed with deionized or distilled water after the desired palladium ion deposit has been effected.

It has been found that if a relatively higher palladium concentration is utilized during this process step, the conductive metal, e.g., copper, subsequently deposited onto the substrate may blister. This is believed to be caused by the electroless copper adhering too quickly to too many sites, thus allowing blisters and other unwanted surface characteristics to form.

After the ceramic substrate has been treated with the palladium activator solution to deposit palladium ions on the surface of the ceramic substrate, the palladium ion-bearing substrate is dipped into a reducing solution to reduce the palladium present from its ionic state of $Pd^{2+}$ to Pd metal, for example, by using an aqueous sodium borohydrate solution. If desired, the ceramic substrate can be then dipped in a weaker reducing solution in order to minimize drag-in into the next bath.

The ceramic substrate is next placed into an electroless metal bath to deposit a layer of the desired conductive metal on the ceramic substrate thereby producing the metal-ceramic composite. The electroless metal used in most cases is electroless copper, which is quite conductive, although electroless nickel, tin, gold, among others, may be utilized as well depending on the desired conductivity characteristics. In the method of the present invention, the electroless deposition bath is conventional except for the fact that the copper ion concentration present is lower than that typically utilized. This results in a relatively slow deposition rate of the electroless copper so that the copper metal grains are very close together and result in a relatively tight and strong copper layer. The copper is deposited at a rate of approximately 0.00002 inch in thirty minutes.

Suitable such electroless copper baths are commercially available from Schering AG, West Germany, or its subsidiary Chemcut Corporation of State College, Pa., under the designation Noviganth ® HC. Electroless copper baths sold by McDermid Co. of Connecticut are also suitable.

The electroless bath also contains: formaldehyde, which acts as a reducing agent for the cupric ions; sodium hydroxide, which acts as a pH adjuster; stabilizers; cyanide; and EDTA [ethylenediaminetetracetic acid $(C_{10}H_{16}N_2O_8)$] which acts as a complexing agent. The copper ion concentration in the bath may be approximately 1 to 2 g/l with the optimum concentration being approximately 1.5 g/l. After the electroless bath, the substrate is rinsed with deionized water.

If a thicker layer of the conductive metal is to be deposited by electroless deposition, the substrate is once again returned to the predip and to the palladium solution where it is once again re-activated. The reducing step and the electroless copper deposition steps are also repeated. The substrate is cycled through the activator, reduction and electroless copper baths two or more times until the total metal thickness required has been deposited. In the case of copper, usually the total electroless copper thickness deposited is about 0.00004 to about 0.00005 inches. After the substrate has been processed through the activation, reducing and electroless deposition steps the desired number of times, it is rinsed with deionized or distilled water.

Unless an additional metal layer is immediately electroplated onto the deposited metal layer, an important step is to enhance the tarnish resistance of the produced composite. This can be achieved using a citric acid/sulfuric acid dip which renders the deposited metal layer, e.g., copper layer, tarnish resistant. Copper is reactive with oxygen, and the metallized substrate is likely to tarnish quickly upon exposure to air without such treatment. The citric acid/sulfuric acid combination reacts with the deposited copper layer to create a citric cupric layer which is not as susceptible to oxidation. By performing this step, the ceramic substrate with the deposited metal may be dried and stored for a period of time, if desired, prior to further processing.

In order to prepare the metal-ceramic composite for further processing steps, the composite is baked at approximately 121° C. (about 250° F.) in order to drive off any moisture entrapped within the deposited copper layer. This entrapped moisture must be removed before any further processing, such as electroplating, so that blistering of the metal layer can be avoided.

The resulting composite, i.e., substrate with its deposited metal layer, is next dipped into a cleaner solution to remove any fingerprints, oxides or other surface contaminants which may have attached to the surface during processing. After the cleaning solution, the composite is rinsed.

The composite is then dipped into a cleaning acid dip (usually at about 10 percent by weight concentration) as a predip for drag-in into the first of two electroplating baths. The thus produced ceramic substrate with the electroless copper deposited thereon can be introduced into copper electroplating baths of differing chemistries. A first plating bath usually is an acid electroplating bath which contains no brighteners, i.e., no organic materials that act as grain refiners for the electroplated metals. Such brighteners cause the metal grains to be smaller, which causes the surface of the deposited metal to appear shiny.

The effect of having no brighteners in the first electroplating solution is that a layer of relatively denser or "less spongy" copper is deposited directly over the relatively low density of "spongy" copper which was deposited via the electroless copper solution.

In a second electroplating bath, brighteners are included, thus a layer of copper which is more dense, or "tighter" than the layer of "less spongy" copper deposited in the first plating bath, is deposited. The layers of copper having different densities produce an increasing density gradient in the metal layer in the direction away from the working surface.

That is, the density of the electroless deposit of copper is less than the density of either of the electroplated layers of copper. Moreover, the density of the electroplated layer of copper in contact with the electroless layer of copper is less than the density of any overlying copper layers deposited by electroplating. In this manner, a cushion of porous copper is provided between the deposited electroless and electrolytic layers. On the other hand, if the entire copper layer to be provided is deposited only by electroless deposition, such a cushion is not needed.

The use of two electroplating baths, the first without brighteners, is important because the "less spongy" copper forms a cushion between the "spongy" electroless copper and the relatively more dense, "tight" copper deposited in the second electroplating bath. In addition, the second electroplating bath has a relatively lower copper concentration and a relatively higher sulfuric acid concentration in order to allow the second electroplating bath to enhance the throwing power through any holes present in the substrate.

After the metal-ceramic composite has been processed in both of the electroplating baths, the composite is spray rinsed and dipped into a citric acid/sulfuric acid solution in order to once again make the metal layer present tarnish resistant. The metal-ceramic composite is then rinsed and dried.

In order to prepare such a substrate, usually bearing plural deposited metal layers, for further processing and ultimate use, the produced composite is fired in a furnace to a temperature which is close to the melting point of the deposited metal or that of the metal composition, e.g., alloy or eutectic, present at the metal layer/ceramic substrate interface. This firing melts at least a portion of the metallic composition present at the interface and improves adhesion of the metal to the ceramic by forming a chemical bond therebetween. In the case of copper on ceramic, this firing melts a eutectic composition and results in a pull strength of approximately 10 to 15 pounds per 100 mil square pad size. This pull strength is usually required in order to produce acceptable fine lines which will withstand subsequent, normal thick film firing cycles.

The metal-ceramic composites are fired in the furnace usually using nitrogen gas ($N_2$) as a cover gas and containing 10 to 15 ppm oxygen gas ($O_2$) in the furnace. The oxygen concentration in the cover gas can be as high as 500 ppm, however. The oxygen gas is believed to react at the interface with the deposited copper to form cuprous oxide and a relatively lower melting eutectic, which in turn facilitates the chemical bond to the ceramic.

After completing these steps as outlined above, the ceramic substrate may then be processed by conventional methods, such as by photo imaging the desired pattern onto the copper covered substrate and electroplating copper, nickel and gold, or other desired metals, on the substrate. Any photoresist used to image the desired patterns on the substrate may then be stripped and any exposed copper etched in order to form the desired patterns.

The following example is given for illustration purposes only and is not intended to limit the present invention in any way.

EXAMPLE

Production of Metal-Ceramic Composite Having Enhanced Bond Strength

A white alumina (96% alumina) ceramic substrate blank was slowly raised in a kiln to a temperature of 1700° F., held at that temperature for 30 to 40 minutes, and then slowly cooled down by exposure to ambient conditions. This process took a full day. The ceramic substrate was then preheated to 200° F. for 5 to 10 minutes in order to prepare the substrate to be dipped in a concentrated phosphoric acid solution at 350° F. (near the boiling point of the phosphoric acid solution) without experiencing severe thermal shock. The ceramic substrate was dipped into the phosphoric acid solution for approximately five minutes in order to condition the surface and to remove any residue left from the laser machining, such as unwanted glasseous forms of ceramic. The substrate was then allowed to cool to room temperature in approximately 15 to 20 minutes. Subsequently, the substrate was rinsed in a deionized water bath and put into a rack for further processing.

The ceramic substrate was then dipped into an ammonium hydrogen fluoride solution at approximately 120° F. and held in that solution for approximately five minutes in order to condition the surface. The ammonium hydrogen fluoride solution had a concentration of approximately two pounds of ammonium hydrogen fluoride per gallon of water. After removal from the ammonium hydrogen fluoride solution, the ceramic substrate was rinsed for two minutes in deionized water.

The ceramic substrate was next dipped into a fluoroboric acid solution containing a wetting agent called Depoison Solution ®, a hydrazine derivative solution, manufactured by Schering, AG. (West Germany), at approximately 120° F. for five minutes. This fluoroboric acid dip acted as a surface conditioner. Thereafter the ceramic substrate was once again rinsed in deionized water for approximately two minutes.

The ceramic substrate was next introduced into a cleaner conditioner with a sodium hydroxide base.

Noviganth Cleaner HC ® manufactured by Schering, AG (West Germany), a glycol-containing aqueous sodium hydroxide solution, was used in order to neutralize the acids from the previous two conditioning baths and to further prepare the surface. The substrate was dipped in this cleaner at approximately 120° F. for five minutes. Once again, the ceramic substrate was rinsed with deionized water for approximately two minutes. If desired, this cleaner could also be used in an acid form with 10 ml $H_2SO_4$/1.

The ceramic substrate was next introduced into a cleaner with a neutral pH, such as Securiganth 902 ® with B23 additive (both available from Schering AG), a water/glycol admixture containing sulfuric acid, to act as a wetting agent for five minutes at approximately 120° F. Thereafter, the ceramic substrate was rinsed with deionized water for approximately two minutes.

The ceramic substrate was then dipped into a sodium persulfate solution for approximately 30 seconds to remove any copper that may have been adhered from the rack and to further condition the surface of the substrate. Thereafter, the substrate was rinsed for two minutes in deionized water.

Before introduction into a palladium activator solution, the ceramic substrate was dipped into a predip solution which acted as a conditioner and wetting agent to prepare the surface for the palladium. The ceramic substrate was dipped in a Neoganth VT ® (Schering AG) predip solution, a water-glycol admixture containing a relatively low sulfuric acid concentration (about 10 milliliters of concentration $H_2SO_4$ per liter of solution) for one minute and then introduced into the palladium solution.

The palladium solution used in this example was Neoganth Activator 834 ® (Schering AG), an aqueous alkaline ionogen system containing palladium ions, boric acid, and a nitrate base complex. This palladium solution was adjusted to a pH value of about 10 to about 13 with sodium hydroxide and the substrate was exposed for approximately six minutes at 90° F. The manufacturer's recommended parameters were to expose the substrate to the solution at a temperature between room temperature and 110° F. for between 3 to 10 minutes. The palladium solution used had a low concentration of palladium ions, approximately 150 ppm of palladium. The manufacturer recommended a concentration of palladium ions of 200 ppm for normal printed circuit use. However, this concentration has been found to cause blistering when used in the present process. If desired, the palladium activator XR-074A by Sel-Rex (OMI Corp., New Jersey) will also work in similar concentrations. The ceramic substrate was then rinsed twice in water for one minute per rinse.

After being dipped in the palladium activator solution and rinsed, the palladium ions deposited on the ceramic substrate were reduced in Reducer WA ® from Schering, AG, an amine borane reducing agent, for four minutes at approximately 90° F. in order to reduce the palladium from the ionic state of $Pd^{2+}$ to Pd metal. Thereafter, the ceramic substrate was dipped into a weaker reducing solution, with approximately one-tenth of the concentration of the previous bath to serve as a drag-in for the electroless copper bath.

A solution of sodium borohydrate at a concentration of 50 g/l and at 120° F. will also reduce the palladium. In addition, a product such as B100 stabilizer from Sel-Rex (New Jersey) will work as well.

Next, the ceramic substrates were introduced into the electroless copper bath, prepared by using an electroless copper bath solution which is sold by Schering AG under the name Noviganth HC ®. The made up electroless copper bath containing Noviganth HC ® had approximately the following composition:
formaldehyde, 5 g/l
sodium hydroxide, 10 g/l
copper carbonate solution (50 grams of Cu per liter),
stabilizer (a cyanide complex), 5% of copper carbonate solution
potassium cyanide, 5 ppm and
EDTA After being in the electroless copper bath for approximately five minutes at 90° F., the resulting metal-ceramic composite was then removed and rinsed for thirty seconds in deionized water. Thereafter, the composite was twice again run through the sequence of steps starting with the predip solution and continuing through the palladium activator solution, two rinses, reducer and electroless bath in order to deposit the desire thickness of copper. Using the present method of depositing copper, approximately 0.00005 inch of electroless copper was deposited on the ceramic substrate.

After being processed through the above steps a total of three times, the composite was then subjected to a final rinse with deionized water for three to five minutes. The substrate was then dipped in a citric acid/sulfuric acid dip with a concentration of 5 g/l citric acid granules and a concentration of 10 ml/l $H_2SO_4$ for approximately three minutes to make the surface of the deposited copper anti-tarnish. The composite was then rinsed with deionized water for one to two minutes and allowed to dry.

The metal-ceramic composite was next baked at 250° F. for approximately two hours to remove any entrapped moisture from the deposited electroless copper. Thereafter, this composite was cleaned for approximately three minutes in a cleaner sold under the name POSICLEAN ® by Chemelex, Inc. of Milwaukee, Wisc., to remove any unwanted surface contaminants, and then rinsed with water. If desired, the balance of the required copper thickness may be deposited by either electroless or electrolytic plating.

In order to begin the electroplating steps, the copper-covered substrate was dipped in a 10 percent by weight sulfuric acid dip as a predip. The metal-ceramic composite was then plated in a first acid electroplating bath containing approximately 1.5 oz/gal of copper as copper sulfate, 32 oz/gal sulfuric acid, 60 ppm of chloride ion, and no brighteners. The electroplating was done at room temperature with a current density of approximately 10 amperes per square foot. The metal-ceramic composite was plated in this first electroplating bath for approximately five minutes. Thereafter, the metal-ceramic composite was electroplated in a second electroplating bath including brighteners and also containing the same low concentration of copper as the first electroplating bath but a higher concentration of sulfuric acid to allow for increased hole penetration of the copper. The chloride concentration of both baths can vary between 50 and 70 ppm. Thereafter, the metal-ceramic substrate composite was spray rinsed with tap water and dipped in a citric acid/sulfuric acid dip with the same concentrations as above to once again make the surface of the copper tarnish resistant. Thereafter, the metal-ceramic composite was rinsed and once again dried.

The so produced composite is fired in an oven which subjects the substrate and the deposited copper layer to temperatures in the range of about 1066° C. to about 1075° C. that produce molten interface regions between the metal and the monolithic ceramic, e.g., in the case of a copper-copper oxide-aluminate eutectic near the eutectic melting point.

This temperature is below the melting temperature of the pure metal itself. For example, the eutectic melting temperature of a copper-copper oxide eutectic is approximately 1066° C. to 1075° C. (1950° F. to 1967° F.), while the melting temperature of pure copper is 1085.4° C. (1984° F.). At these firing temperatures, only the copper/copper oxide eutectic composition is molten and thus is believed to bond the copper atoms in the deposited copper layer with the oxygen atoms of the aluminum oxide of the substrate, and may form a copper aluminate alloy as well.

The metal-ceramic composite is fired in a furnace or other suitable heating device. For example, an electric flow-through hybrid furnace which has a top temperature of approximately 1100° C. and a rate of travel of approximately six inches per minute over a twenty-seven foot length of furnace may be used. Using this furnace, the metal-ceramic composite is exposed to the top furnace temperature for approximately 3 minutes; however, this exposure did not permit the deposited copper layer to reach melting temperature. Of course, thicker layers of copper require longer periods of time to reach the eutectic temperature and thus would need to be subjected to the top furnace temperatures for a longer period of time. After being fired in the furnace, the substrate is then allowed to cool for further processing by conventional methods.

The furnace utilizes a cover gas which is essentially nitrogen gas, or other inert gases which are nonreactive with oxygen, such as helium. In addition, oxygen either as oxygen gas or a compound that decomposes to produce oxygen gas, e.g., $N_2O_2$, may be added to the furnace in order to form a copper oxide layer if the part to be fired has not already oxidized. Generally, the amount of oxygen required is directly related to the thickness of the copper layer. For example, 0.1 mil copper requires 50 ppm of oxygen. This required oxygen may be supplied by introducing oxygen or oxygen source gas into the furnace at a controlled rate. The copper oxide layer may also be supplied, if desired, by other methods.

After the composite has been fired and cooled, a strong bond is formed between the deposited metal layer and the substrate. For example, the pull strength of the copper layer processed may be double or greater than the pull strength of the unfired copper layer. For example, a 100 mil square pad according to the method of the present invention has been determined to have a pull strength of between 20 and 30 pounds per 100 mil square pad. It has also been shown in tests that a 100 mil square copper pad on 25 mil thick ceramic substrate will result in the substrate shattering before the copper can be pulled from the substrate.

Although the present invention has been described with reference to the preferred embodiments, workers skilled in the art may recognize that changes may be made in form and detail without departing from the spirit and scope of the invention.

I claim:

1. A metal-ceramic composite comprising:
   a ceramic workpiece having a working surface unitary with the workpiece;
   a layer of electrically conductive metal on said working surface; and
   a heterogeneous juncture band between said ceramic workpiece and said conductive metal layer, substantially coextensive with said conductive metal layer and said working surface;
   said heterogeneous juncture band having a metal-wetted surface area that is at least about twice the apparent surface area of the metal layer overlying the juncture band and consisting essentially of ceramic grains unitary with said workpiece and conductive metal unitary with said conductive metal layer, and being constituted by finger-like metal protuberances unitary with the metal layer and occupying the space between the ceramic grains; and said metal-ceramic composite being capable of withstanding repeated firing cycles at a temperature in excess of 850° C. without separation of the metal layer from the working surface of the ceramic workpiece.

2. The composite in accordance with claim 1 wherein said layer of conductive metal has a thickness of at least about 0.00004 inch.

3. The composite in accordance with claim 1 wherein said conductive metal is copper.

4. The composite in accordance with claim 3 wherein said juncture band is at least about 8 micrometers thick.

5. The composite in accordance with claim 3 wherein said juncture band is about 9 to about 13 micrometers thick.

6. The composite in accordance with claim 1 wherein said conductive metal is copper and said ceramic is alumina.

7. The composite in accordance with claim 1 wherein said conductive steel metal is copper and said ceramic is beryllia.

8. The composite in accordance with claim 1 wherein said conductive layer is copper and said ceramic is aluminum nitride.

9. An apertured metal-ceramic composite comprising;
   a ceramic workpiece that defines at least one through passageway from one face of the ceramic workpiece to another face thereof;
   a layer of electrically conductive metal on each of said faces and within said through passageway, the layer of electrically conductive metal within said through passageway providing a conductive path from said one face of the ceramic workpiece to the said other face of the workpiece; and
   a heterogeneous juncture band between, and substantially coextensive with, said ceramic workpiece, including said through passageway, and said conductive metal layer;
   said heterogeneous juncture band having a metal-wetted surface area that is at least about twice the apparent surface area of the metal layer overlying the juncture band and consisting essentially of ceramic grains unitary with said workpiece and said conductive material, and being constituted by finger-like metal protuberances unitary with the metal layer and occupying the space between the ceramic grains; and said metal-ceramic composite being capable of withstanding repeated firing cycles at a temperature in excess of 850° C. without separation of the metal layer from the working surface of the ceramic workpiece.

* * * * *